June 28, 1960 R. F. RUTZ 2,942,329

SEMICONDUCTOR DEVICE FABRICATION

Filed Sept. 25, 1956

INVENTOR.
RICHARD F. RUTZ

BY

Alvin J. Riddles

AGENT

United States Patent Office 2,942,329
Patented June 28, 1960

2,942,329

SEMICONDUCTOR DEVICE FABRICATION

Richard F. Rutz, Fishkill, N.Y., assignor to International Business Machines Corporation, New York, N.Y., a corporation of New York Filed Sept. 25, 1956, Ser. No. 611,999

2 Claims. (Cl. 29—25.3)

This invention relates to the fabrication of semiconductor devices and in particular to establishing a physical dimension of a semiconductor device by electrical means.

As a result of considerations produced by the phenomena of minority carrier storage, carrier transit time and electrical breakdown of junctions in semiconductor material, it has been found necessary in the art to precisely control the physical dimension of a semiconductor crystal between the electrodes attached thereto. Further, the control of this dimension in the case of semiconductor crystals having a graded resistivity is made increasingly difficult by the fact that the resistivity is varying and that a particular resistivity at the surface to which an electrode is attached, is usually desired.

Accordingly, what has been discovered is a method of precisely establishing a very small physical dimension of a semiconductor crystal having a graded resistivity by electrical means and, at the same time, establishing the value of the resistivity of the semiconductor crystal surface at that dimension.

This method is of particular advantage in establishing the base region thickness and resistivity of a graded resistivity base transistor with respect to a junction, the location of which is not precisely established.

A primary object of this invention is to provide a method of establishing the distance between two points in a graded resistivity semiconductor crystal.

Another object is to provide a method of establishing the thickness of the base region of a graded resistivity base transistor.

A related object is to provide a method of establishing the resistivity at the surface of a semiconductor crystal.

Other objects of the invention will be pointed out in the following description and claims and illustrated in the accompanying drawings, which disclose, by way of example, the principle of the invention and the best mode, which has been contemplated of applying that principle.

The method of establishing a physical dimension with relation to a junction in a semiconductor crystal of this invention is based upon the fact that the reverse breakdown voltage of a rectifying contact made to the surface of a semiconductor crystal is proportional to the logarithm of the resistivity of the semiconductor crystal immediately adjacent to the contact.

There are several methods known in the art for providing a graded resistivity in a selected region of a semiconductor crystal such as rate growing, diffusion and moving impurities by means of an electric field. A preferred one of these methods is the technique of gaseous diffusion described in copending application, Serial Number 589,953, filed June 7, 1956, and assigned to the assignee of this application. Through the use of this technique, a semiconductor crystal can be provided with a resistivity gradient that closely approaches an exponential rate of change and penetrates to a very accurately determinable depth. With accurate knowledge of the nature of the resistivity gradient with respect to depth it is possible to correlate reverse breakdown voltage in terms of crystal dimension.

Figure 1:
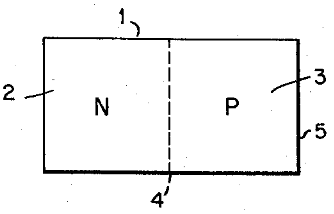
Figure 1 is a view of a section of a semiconductor crystal.

Referring now to Figure 1, a section of a semiconductor crystal 1 is shown comprising a region of N type conductivity 2 and a region of P type conductivity 3 separated by a junction barrier 4. The region of P type conductivity has a gradient of resistivity such as could be produced by a diffusion operation. The resistivity varies from one value at the surface 5 to a different value at the junction 4.

Figure 2:
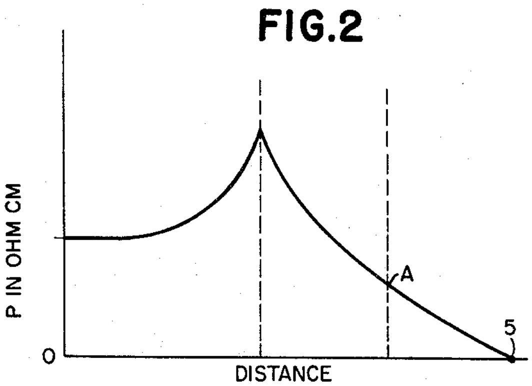
Figure 2 is a graph showing the variation of resistivity in the crystal of Figure 1.

Referring now to Figure 2, a graph of a possible variation in the resistivity with distance from the surface 5 of the crystal in Figure 1 is shown. The resistivity at the surface 5 as a result of an operation such as the diffusion operation described in the above copending application varies from near zero at the surface approximately exponentially to a cusp and then decreasing exponentially to a constant value, which value represents the original resistivity of the N type region prior to the diffusion operation. The two arcs of the resistivity curve tangent to the cusp define a point which is near intrinsic resistivity and represents the vicinity of the PN junction 4 of Figure 1.

It should be noted that in this example the associated altering of conductivity type of the crystal 1 as a result of the diffusion operation is done for illustration purposes only since as will be apparent later the method of this invention is operable on any semiconductor crystal having a gradient of resistivity regardless of conductivity type so long as there is information available as to the variation of resistivity with depth in the crystal.

In the fabrication of semiconductor devices such as transistors from the crystal of Figure 1, it is essential for proper performance under many conditions that the dimension from the junction 4 to the surface 5 be very precisely controlled and in many cases that the resistivity at the surface 5 be known. An example of such a transistor is shown in copending application, Serial Number 548,310, filed November 22, 1955, and assigned to the assignee of this application. The conventional methods used in the art for the control of this dimension are generally the removal by abrading or etching away of the surface 5 and physical measurment until the proper distance between the junction 4 and the surface 5 is achieved. Through the method of this invention it is possible to calibrate the amount of remaining material left when a portion of the P type region of Figure 1 is removed in terms of the reverse breakdown voltage of a rectifying contact made to the surface 5 of the crystal 1 of Figure 1.

Figure 3:
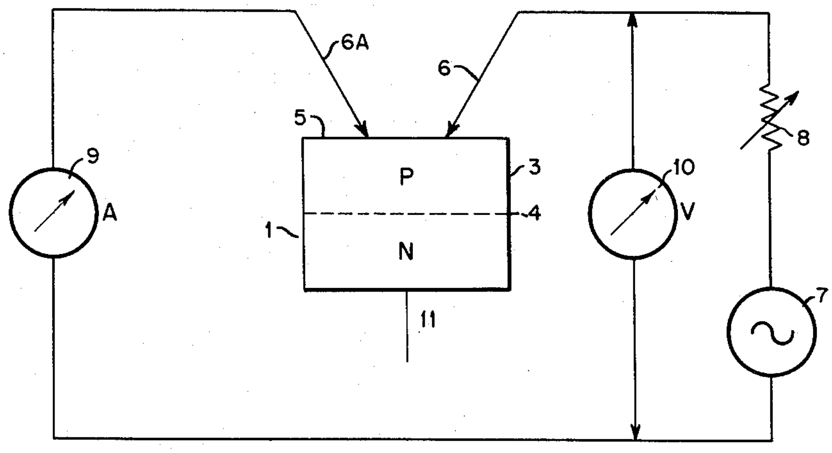
Figure 3 is a wiring diagram illustrating the method of this invention.

Referring now to Figure 3, a wiring diagram is shown illustrating one method of practicing this invention. In Figure 3, the crystal of Figure 1 is shown having two, not critically spaced point contacts 6 and 6A bearing on the surface 5. A source of alternating potential 7 having one terminal connected through a load impedance 8 to the point contact 6 and the other terminal connected through a current meter 9 to point contact 6A, a volt meter 10 is connected across the A.C. source 7 and the impedance 8. The point contacts 6 and 6A may be of any material capable of forming a rectifying contact with the crystal 1 and it has been found that for germanium crystal tungsten provides a very satisfactory material.

In operation the A.C. source 7 provides a potential of sufficient magnitude that the peak in any one direction will be sufficient to break down the back resistance of a rectifying contact for the entire range of resistivities to be encountered in the crystal 1. As the potential from the A.C. source 7 swings in the negative direction contact 6 is reverse biased and contact 6A serves as an ohmic contact. The potential rises until the reverse breakdown voltage is reached at which point the volt meter 10 serves an an indication of the magnitude of the breakdown potential level. When the polarity from the source 7 reverses contact 6A becomes the rectifying contact and contact 6 serves as the ohmic contact. It will be apparent that it is also possible to use an ohmic contact attached to the crystal for example, by soldering and a single rectifying contact, in which case a single polarity, variable potential source would be used.

Figure 4:
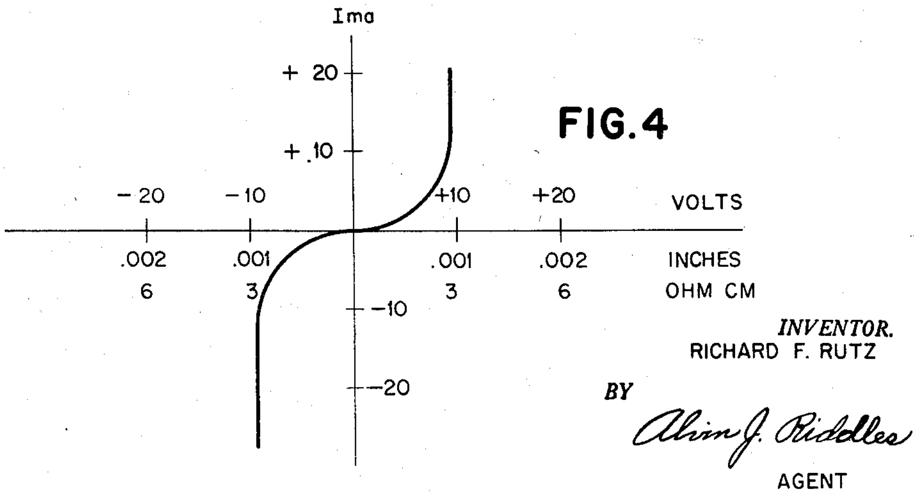
Figure 4 is a graph showing the calibration of the reverse breakdown voltage of a rectifying contact in terms of crystal dimensions.

In Figure 4 there is shown a current voltage graph of the circuit of Figure 3 and calibrated in terms of resistivity and crystal thickness, taken by plotting values of readings on meters 9 and 10 as a result of varying impedance 8. It will be apparent to one skilled in the art that the curve of Figure 4 can be plotted instantaneously on a cathode ray oscilloscope by feeding the signals of meters 9 and 10 simultaneously into the vertical and horizontal plates.

Considering the circuit of Figure 3 in connection with the graph of Figure 4, it will be apparent that as the back potential on the rectifying contact 6 rises, the reverse breakdown voltage of the contacts, as indicated by the knee of the curve in Figure 4 will occur at a particular level of one polarity of the signal supplied by source 7. Since the reverse breakdown voltage of a rectifying contact made to the surface of a semiconductor crystal is proportional to the log of the resistivity of the semiconductor material immediately adjacent to the contact and further, knowing the relationship of the resistivity gradient in the crystal to depth with respect to the surface, it will be possible to take the current voltage characteristic of the point contacts 6 and 6A as shown in Figure 4 and calibrate the curve in terms of thickness of the P region 3. This may be further illustrated by referring to Figures 2, 3 and 4. Considering in Figure 2 the gradient of resistivity from the surface 5 inward in the P region 3, it may be seen that if a particular point A is selected as being at the desired distance from the junction 4 and as having the desired resistivity value, if the portion of the crystal from the surface 5 to the point A is removed, a breakdown voltage characteristic of the resistivity of the surface at that point will exist so that a graph as in Figure 4, obtained from a circuit similar to Figure 3, may be calibrated in terms of thickness of the P region 3 of the crystal 1. Then by removing portions of the P region 3 and observing the curve of Figure 4 when the crystal 1 is connected in the circuit of Figure 3, it is possible to achieve the accurate physical dimension corresponding to point A of Figure 2 by electrical means. If a single rectifying contact and an ohmic contact such as 11 are used only one quadrant of the curve of Figure 4 need be considered.

The relationship of the resistivity gradient to depth in the crystal is obtainable from the record of the resistivity conversion operation or by study of a sample that is part of a group of crystals subjected to the same conditions. As an example of order of magnitude a diffusion operation on a germanium crystal having 6 ohm centimeter resistivity for a period of 24 hours at an impurity concentration of $10^{16}$ atoms per cubic centimeter will produce a graded resistivity region that is approximately exponential, varying from near zero at the surface to the original resistivity of the sample at a depth of approximately .0015 inch.

While there have been shown and described and pointed out the fundamental novel features of the invention as applied to a preferred embodiment, it will be understood that various omissions and substitutions and changes in the form and details of the device illustrated and in its operation may be made by those skilled in the art without departing from the spirit of the invention. It is the intention therefore, to be limited only as indicated by the scope of the following claims.

What is claimed is:

1. The method of establishing the base region thickness of a graded resistivity base semiconductor device comprising the steps of applying two point rectifying contacts to a surface of the base of said semiconductor device, impressing an alterating current signal between said contacts, observing the reverse breakdown potential level of said contacts and removing material from said base region until the reverse breakdown potential level of said rectifying contacts reaches a predetermined value.

2. The method of making a semiconductor device body with a particular dimension comprising in combination the steps of providing a semiconductor crystal having a gradient of resistivity therein the variation of which with respect to a physical dimension of said crystal is known, applying a rectifying connection to said crystal on a surface of the portion of said crystal having said known gradient, applying a variable potential level in the reverse direction between said crystal and said rectifying connection, observing the reverse breakdown potential level of said connection and removing sufficient material from the surface of said crystal to which said rectifying connection is made to cause said observed reverse breakdown potential to reach a value correlated with said known resistivity gradient.

References Cited in the file of this patent

UNITED STATES PATENTS

| | | |
|---|---|---|
| 2,577,803 | Pfann | Dec. 11, 1951 |
| 2,653,374 | Matthews | Sept. 29, 1953 |
| 2,671,156 | Douglas | Mar. 2, 1954 |